United States Patent [19]

Omori et al.

[11] Patent Number: 5,505,781
[45] Date of Patent: Apr. 9, 1996

[54] HYDROPHOBIC PROCESSING APPARATUS INCLUDING A LIQUID DELIVERY SYSTEM

[75] Inventors: Tsutae Omori, Yamanashi; Kouji Harada, Kumamoto; Takami Satoh, Kumamoto; Noriyuki Anai, Kumamoto; Masafumi Nomura, Kumamoto, all of Japan

[73] Assignees: Tokyo Electron Limited; Tokyo Electron Kyushu Limited, both of Japan

[21] Appl. No.: 189,071

[22] Filed: Jan. 28, 1994

[30] Foreign Application Priority Data

Jan. 29, 1993 [JP] Japan .................................. 5-034204

[51] Int. Cl.⁶ .................................................... C23C 16/00
[52] U.S. Cl. .................................... 118/726; 118/715
[58] Field of Search ................................. 118/726, 715

[56] References Cited

U.S. PATENT DOCUMENTS

| | | | |
|---|---|---|---|
| 4,459,267 | 7/1984 | Bunce | 422/100 |
| 4,870,923 | 10/1989 | Sugimoto | 118/715 |
| 4,892,615 | 1/1990 | Motta | 156/643 |
| 5,070,814 | 12/1991 | Whiffin | 118/715 |
| 5,203,925 | 4/1993 | Shibuya | 118/724 |
| 5,252,134 | 10/1993 | Stauffer | 118/726 |
| 5,383,970 | 1/1995 | Asaba | 118/726 |

FOREIGN PATENT DOCUMENTS 0177368  10/1994  Japan ................................. 118/726

*Primary Examiner*—R. Bruce Breneman
*Assistant Examiner*—Jeffrie R. Lund
*Attorney, Agent, or Firm*—Graham & James

[57] ABSTRACT

An apparatus for hydrophobic treatment of a semiconductor wafer comprises a tank in which HMDS liquid is stored, a process chamber in which the wafer is treated, and a unit for supplying HMDS liquid from the tank into the process chamber in an amount needed at any desired time. The process chamber can be decompressed by an ejector which is connected to the process chamber through an exhaust pipe. A mount on which the wafer is mounted is arranged in the process chamber and it includes a heater embedded therein. A ring surrounds the mount and two liquid receiving recesses are formed on the top of the ring. Two HMDS liquid supply pipes extend just above their corresponding liquid receiving recesses. HMDS in liquid phase is supplied into the process chamber and vaporized in it. The density of HMDS gas in the process chamber is controlled by adjusting the amount of HMDS liquid supplied.

11 Claims, 6 Drawing Sheets

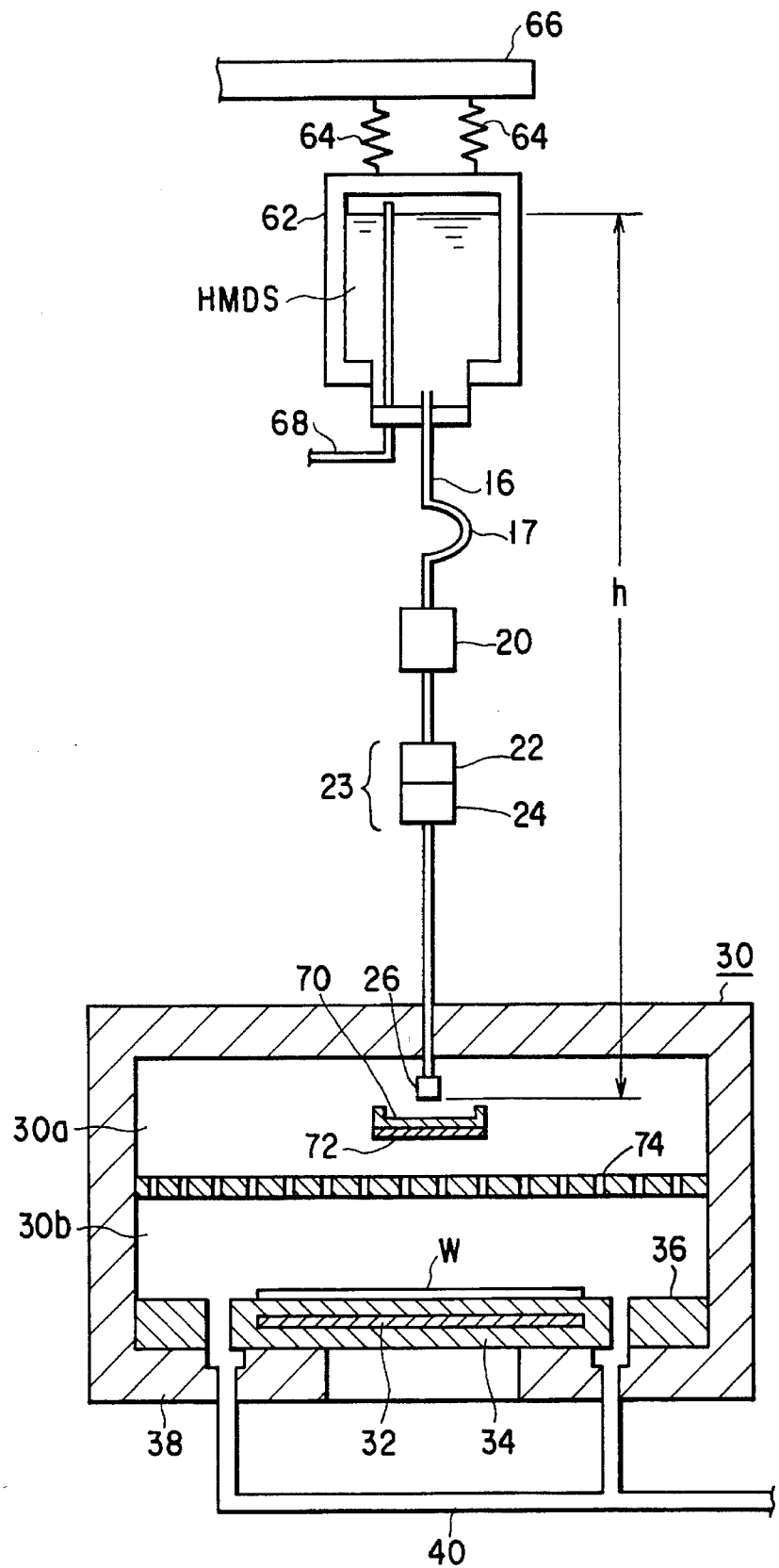
F I G. 5

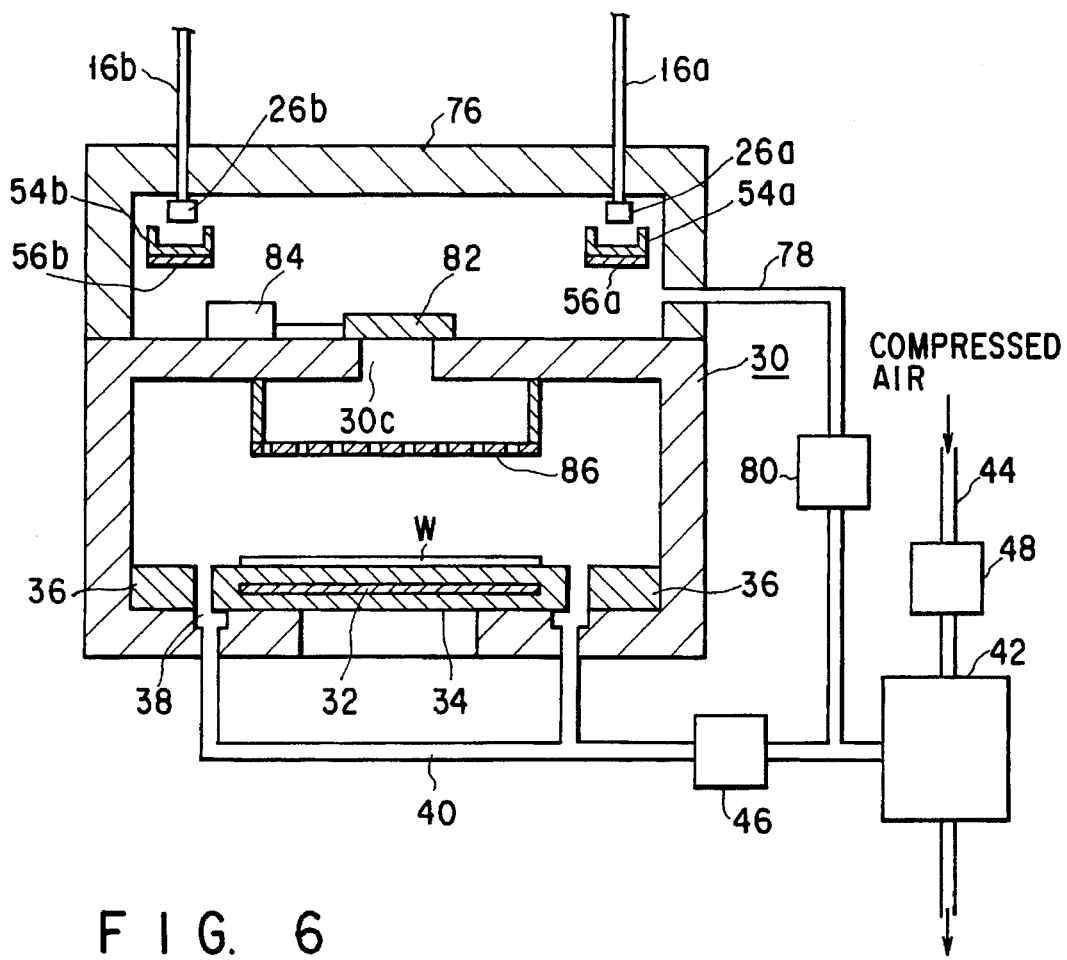
F I G. 6
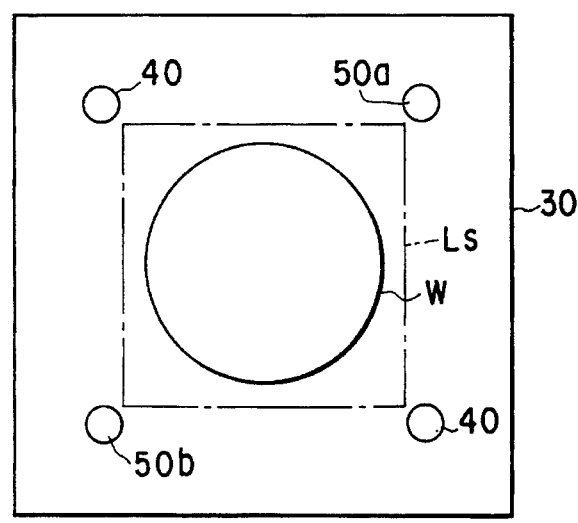
F I G. 8

HYDROPHOBIC PROCESSING APPARATUS INCLUDING A LIQUID DELIVERY SYSTEM

BACKGROUND OF THE INVENTION

1. Field of the Invention

The present invention relates to processing apparatus and method and, more particularly, it relates to apparatus and method for hydrophobic treatment of the surface of a substrate such as a semiconductor wafer with process gas.

2. Description of the Related Art

The semiconductor manufacturing process usually includes a step of forming a photoresist film on a substrate such as a semiconductor wafer. Before the resist film is formed on the wafer, moisture in atmosphere combines with the wafer surface and OH groups exist on it. Therefore, it becomes hydrophilic. When it is coated with the resist film under this state, the adhesion of the resist film relative to it is not firm. Therefore, there is fear that the resist film peels off from it at the film developing step.

In order to increase the adhesion of the resist film relative to the wafer surface, the wafer surface is subjected to a hydrophobic treatment in such a way that hexamthyl-disilazane $[(CH_3)_3SiNHSi(CH_3)_3]$ (which will be herein-after referred to as HMDS) gas is caused to adhere to the wafer surface, prior to the resist film coating step, to replace OH groups on it by $Si(CH_3)_3$ ones. This hydrophobic treatment is intended to increase the adhesion of the resist film relative to the wafer surface. This is the reason why it is also called adhesion treatment.

As disclosed in U.S. Pat. No. 4,870,923, a process agent such as HMDS is supplied, as vapor, into the process chamber in the conventional hydrophobic treatment apparatus. A substrate such as a semiconductor wafer is mounted on a heating plate in the process chamber. The semiconductor wafer is heated to a predetermined temperature while exposing it in HMDS vapor introduced into the process chamber. As the result, the surface of the semiconductor wafer is made hydrophobic. After this process, gas is exhausted from the process chamber through an exhaust pipe.

HMDS is usually stored in liquefied state in a tank arranged remote from the process chamber. A bubbler is arranged on the bottom of the tank and carrier gas such as N gas is supplied from it into the layer of HMDS liquid. HMDS liquid vaporises and dissolves into bubbles of carrier gas generated and comes to a space in the upper portion of the tank. This mixed gas of HMDS and carrier gases is supplied into the process chamber through a pipe to which a flow meter is attached.

In the above-described conventional hydrophobic treatment apparatus, the amount of carrier gas supplied to the bubbler is changed to control the amount of HMDS gas generated in the tank, that relates to the density of HMDS gas in the process chamber. However, no proportional relation exists between the amount of carrier gas supplied and the amount of HMDS gas generated. This makes it difficult to control the density of HMDS gas in the process chamber with high accuracy.

Further, it sometimes happens that a part of HMDS gas is liquefied into drops and that these liquid drops adhere to the inner wall of the supply pipe when mixed gas is flowing through the pipe. This is likely to happen particularly when the density of HMDS gas is high in the mixed gas and when the temperature of HMDS gas is quite different from temperature around the pipe. When HMDS gas is liquefied into drops in the supply pipe and they enter into the process chamber and adhere to the wafer, pinholes and the like are formed on the wafer, thereby lowering the productivity of wafers. Further, there is fear that a fire may start when HMDS liquid drops contact with the heater of a wafer heating unit in the process chamber.

SUMMARY OF THE INVENTION

The object of the present invention is therefore to control the density of process gas in the process chamber with a higher accuracy and to prevent process gas from being liquefied into drops and eliminate any disadvantages thus caused.

According to the present invention, there is provided a method of subjecting a surface of a substrate to a hydrophobic treatment with a process agent in vapor phase by using an apparatus which comprises, a container having a first space containing the process agent in liquid phase, a casing having second and process spaces, the second space being used to vaporize the process agent, the process space being used to house the substrate therein and to expose the surface of the substrate in the process agent in vapor phase so as to subject it to the hydrophobic treatment, and the second space being capable of communicating with the process space, a conduit for feeding the process agent in liquid phase from the first space to the second space, means for vaporizing the process agent, arranged in the second space, means for supporting the substrate, arranged in the process space, and means for adjusting the amount of the process agent in liquid phase fed to the second space through the conduit to control the density of the process agent in vapor phase in the process space, the method comprising the steps of: placing the substrate in the process space; determining a value of the density of the process agent in vapor phase in the process space, and supplying an amount of the process agent in liquid phase, which is calculated from the determined value of the density, into the second space; vaporizing substantially all of the process agent in liquid phase, which is supplied into the second space, by the means for vaporizing; and subjecting the surface of the substrate to the hydrophobic treatment in the process space while exposing the surface in the process agent vaporized by the means for vaporizing.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a partly-sectioned view showing the hydrophobic treatment apparatus according to a second embodiment of the present invention;

FIG. 6 is a partly-sectioned view showing the hydrophobic treatment apparatus according to a third embodiment of the present invention;

FIG. 8 is a plan view schematically showing how liquid-receiving recesses are positioned relative to two exhaust openings of an exhaust pipe.

DETAILED DESCRIPTION OF THE PREFERRED EMBODIMENTS

Figure 1:
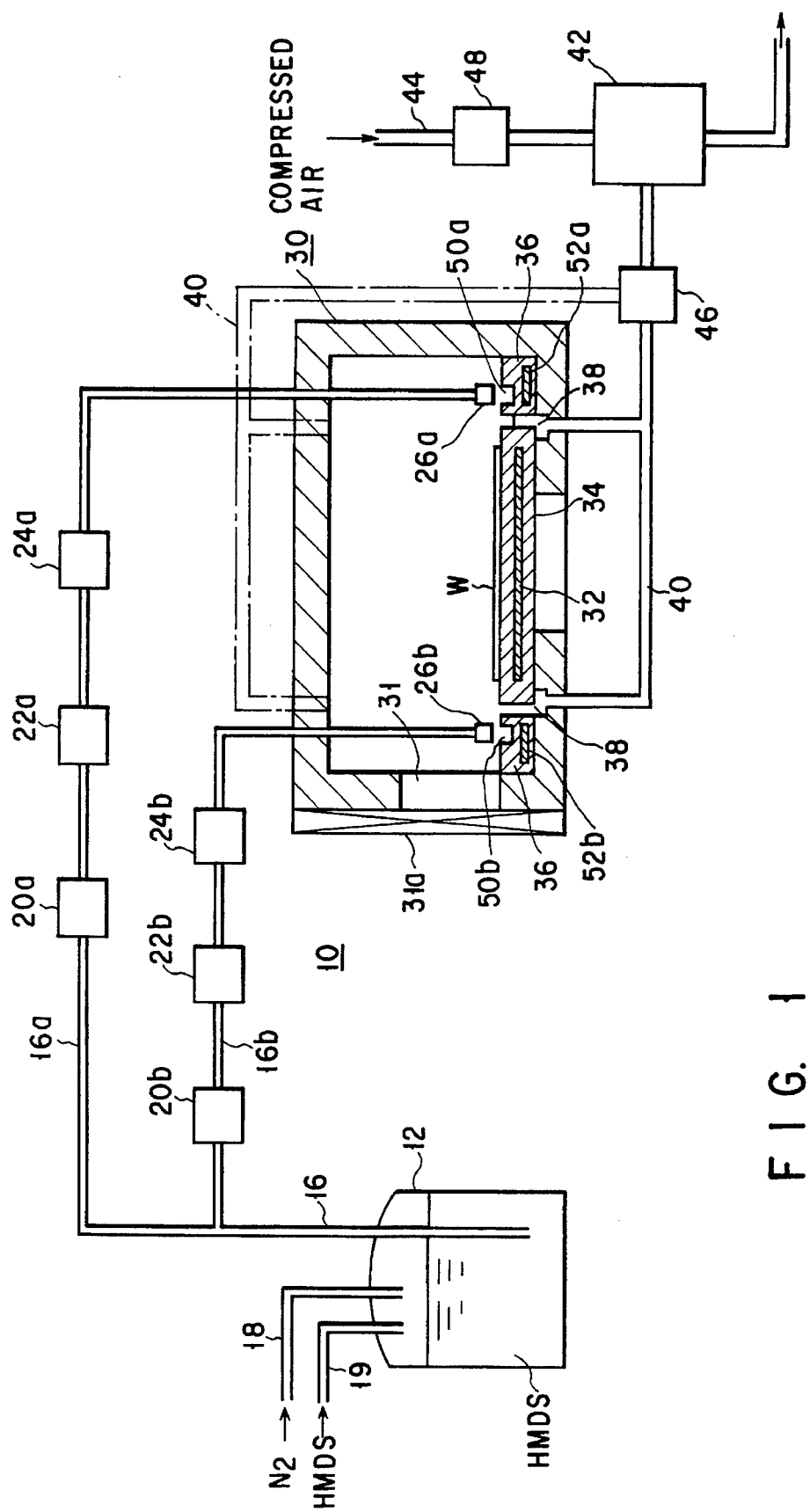
FIG. 1 is a partly-sectioned view showing the hydrophobic treatment apparatus according to a first embodiment of the present invention.

The hydrophobic treatment apparatus according to a first embodiment of the present invention shown in FIG. 1 includes a process chamber 30 in which hydrophobic treatment is applied to a semiconductor wafer W one by one while exposing it to HMDS gas. A process agent supply unit 10 is connected to the process chamber 30 to supply a predetermined amount of liquefied HMDS, for example, to the process chamber 30.

The supply unit 10 includes a tank 12 in which HMDS is stored in liquid phase. A pipe 16 is arranged between the tank 12 and the process chamber 30 and its one end enters into the layer of HMDS liquid in the tank 12 and terminates adjacent to the bottom of the tank 12. A gas supply pipe 18 through which pressurizing inert gas such as $N_2$ gas is introduced into the tank 12 also extends into the tank 12 and terminates adjacent to the ceiling thereof. A pipe 19 through which HMDS liquid is supplied from an auxiliary tank (not shown) into the tank 12 also extends into the tank 12 and terminates adjacent to the ceiling thereof.

The other end of the pipe 16 is divided into plural or two pipes 16a and 16b whose ends extend into the process chamber 30. They include needle valves 20a, 20b, switch valves 22a, 22b and suck-back valves 24a, 24b. The needle valves 20a and 20b are intended to control certainly the amount of HMDS liquid flowing through each of the pipes 16a and 16b. The switch valves 22a and 22b are usually closed but opened for a certain time period at a predetermined timing when hydrophobic treatment is to be applied to the semiconductor wafer W in the process chamber 30. The suck-back valves 24a and 24b use diaphragms and they are intended to suck back HMDS liquid remaining in the tip of each of the pipes 16a and 16b.

The process chamber 30 can be closed air-tight. An opening 31 through which the semiconductor wafer W can be carried into and out of the process chamber 30 is formed in one side wall of the process chamber 30 and a shutter 31a is arranged outside and along the side wall of the process chamber 30 to close and open the opening 31. A disk-like mount 34 in which heater means such as a heating resistance 32 is embedded is arranged on the bottom of the process chamber 30 and a ring 36 surrounds it with a clearance 38 of about 2–5 mm interposed between them.

An exhaust pipe 40 is divided, at its one end, into two pipes communicating with the process chamber 30 through the bottom of the process chamber 30 and also through the clearance 38 between the mount 34 and the ring 36. Connected to the other end thereof is an ejector (or pneumatic vacuum unit) 42 to make the process chamber 30 negative in pressure. A supply pipe 44 is connected to the ejector 42 to supply compressed drive air to the ejector 42 through it. The supply and exhaust pipes 40 and 44 include switch valves 46 and 48, respectively.

The exhaust pipe 40 may be connected to the top of the process chamber 30, as shown by broken lines in FIG. 1, instead of connecting it to the bottom thereof. When it is connected to the top of the process chamber 30, the apparatus can be made simpler and maintaining work added to it can be made easier.

Plural or two liquid receiving recesses 50a and 50b are formed in the top of the ring 36 on a straight line or at an angle of 180°. Each of them is 10 mm wide, 20 mm long and 5 mm deep, for example. The pipes 16a and 16b extend just above their corresponding recesses 50a and 50b, sealingly passing through the top of the process chamber 30 through fittings (not shown). Attached to their front ends are nozzles 26a and 26b. Heating means or resistance heaters 52a and 52b are embedded, adjacent to the recesses 50a and 50b, in the ring 36.

As shown in FIG. 8, it is desirable that two openings of the exhaust pipe 40 are arranged on a straight line crossing that line on which the liquid receiving recesses or portions 50a and 50b are arranged. Where arranged in this manner, the liquid receiving portions 50a and 50b can be separated enough from two openings of the exhaust pipe 40 and the diffusing of HMDS gas can be enhanced in the process chamber 30. This arrangement of the liquid receiving portions 50a, 50b and two openings of the exhaust pipe 40 is also kept unchanged when an LCD substrate is shown by broken lines in FIG. 8 is to be treated instead of the semiconductor wafer W.

It will be described how the semiconductor wafers W are treated by the above-described hydrophobic treatment apparatus according to the first embodiment of the present invention.

The shutter 31a for the opening 31 of the process chamber 30 is opened and a semiconductor wafer W is carried into the process chamber 30 and then onto the mount 34 by a carrier arm (not shown). When the semiconductor wafer W is loaded on the mount 34 in this manner, the shutter 31a is closed and the process chamber 30 is thus kept air-tight. The switch valve 48 is then opened to supply compressed drive air to the ejector 42. The ejector 42 is thus made operative. The switch valve 46 is then opened to exhaust the process chamber 30. The process chamber 30 is thus a little decompressed from atmospheric pressure by about 30 mmHg. The exhaustion of the process chamber 30 is stopped or its rate is lowered while HMDS liquid is vaporized and the hydrophobic treatment is carried out in the chamber 30.

On the other hand, current is supplied to the resistance heaters 32, 52a and 52b. The wafer W on the mount 34 is thus heated to a predetermined process temperature of about 110° C., for example, and the recesses 50a and 50b in the top of the ring 36 are also heated to a predetermined temperature of about 150° C.

Pressurising $N_2$ gas is introduced into the tank 12 through the pipe 18. When the pressure in the process chamber 30 and temperatures of the above-mentioned components reach predetermined values as described above, the valves 22a and 22b are opened at the same time and then closed after the lapse of a predetermined time. Just after they are completely closed and the supply of HMDS liquid is finished, the suck-back valves 24a and 24b are made operative to suck back HMDS liquid which remain in the nozzles 26a and 26b.

A predetermined amount of HMDS liquid which is needed for hydrophobic treatment is thus supplied from the tank 12 into the process chamber 30 through the pipes 16a and 16b. In the case of the 8-inch semiconductor wafer, for example, HMDS liquid of total 0.5 cc is supplied into the process chamber 30. The valves 22a and 22b may be kept open for a predetermined time or they may be intermittently opened and closed predetermined times at a certain cycle. The amount of HMDS liquid flowing through the pipes 16a and 16b is controlled certain by the needle valves 20a and 20b. Therefore, the amount of HMDS liquid supplied into the process chamber 90 can be made proportional to the time during which the valves 22a and 22b are kept open.

When the predetermined amount of HMDS liquid is dropped in the recesses 50a and 50b in the process chamber 30 through the nozzles 26a and 26b, all of the HMDS liquid thus dropped is instantly vaporized into HMDS gas. Since the process chamber 30 is kept decompressed, this HMDS gas vaporized in the recesses 50a and 50b is quickly diffused in the process chamber 30. The vaporizing speed of HMDS liquid depends on pressure and temperature in the process chamber 30 and HMDS liquid can be quickly vaporized under the above-mentioned wafer treatment conditions of about 110° C. and −30 mmHg. It is therefore not essential but helpful to promote the vaporization of HMDS liquid that the liquid receiving portions 50a and 50b are heated to the predetermined temperature of about 150° C.

The semiconductor wafer W on the mount 34 is heated for a certain time while being exposed in the atmosphere of HMDS gas. As the result, its surface can be made appropriately hydrophobic by HMDS gas.

According to the first hydrophobic treatment apparatus, the predetermined amount of HMDS liquid is supplied into the process chamber 30, as described above, when a semiconductor wafer W is to be treated. The HMDS liquid thus supplied is vaporized into HMDS gas in the process chamber 30. The semiconductor wafer W is heated while exposing it in the atmosphere of HMDS gas. As the result, the surface treatment of the semiconductor wafer W (or hydrophobic treatment) can be achieved. The density of HMDS gas atmosphere is proportional to the amount of HMDS liquid supplied into the process chamber 30. This amount of HMDS liquid supplied can be accurately controlled by the extent to which the needle valves 20a and 20b are opened and by the time during which the switch valves 22a and 22b are kept open. When the amount of HMDS liquid supplied is controlled in this manner, therefore, the density of HMDS gas atmosphere in the process chamber 30 can be accurately controlled.

The pressure in the process chamber 30 can be adjusted as desired. In addition, the temperature of the recesses 50a and 50b in the ring 36 can also be adjusted as desired, independently of the temperature of the mount 34. When the pressure in the process chamber 30 and the temperature of the recesses 50a and 50b are adjusted, therefore, the vaporizing speed of HMDS liquid in the process chamber 30 can be adjusted as desired. The heating of the resistances 52a and 52b may be stopped just after the generation of HMDS gas. The pressure in the process chamber 30 may be changed to a value suitable for hydrophobic treatment just after the generation of HMDS gas.

According to the first hydrophobic treatment apparatus, no HMDS gas is supplied through a pipe into the process chamber 30. Therefore, the condensing of HMDS gas into liquid drops is not caused in the pipe. In other words, no liquid drop adheres to the wafer W and the mount 34. This prevents the productivity of semiconductor wafers from being lowered. In addition, there is no fear that any fire is set.

In the above-described hydrophobic treatment apparatus, two liquid receiving portions 50a and 50b in which HMDS liquid is vaporized are formed in the top of the ring 36 which surrounds the mount 34 in the process chamber 30. The ring 36 is detachable, and the liquid receiving portions 50a and 50b can be easily repaired. When it is detached and exchanged with a new one, they can be made new. However, this is an example. Needless to say, the material, structure, number and position of them can be modified and changed variously. Some variations of them will be described below.

Figure 2:
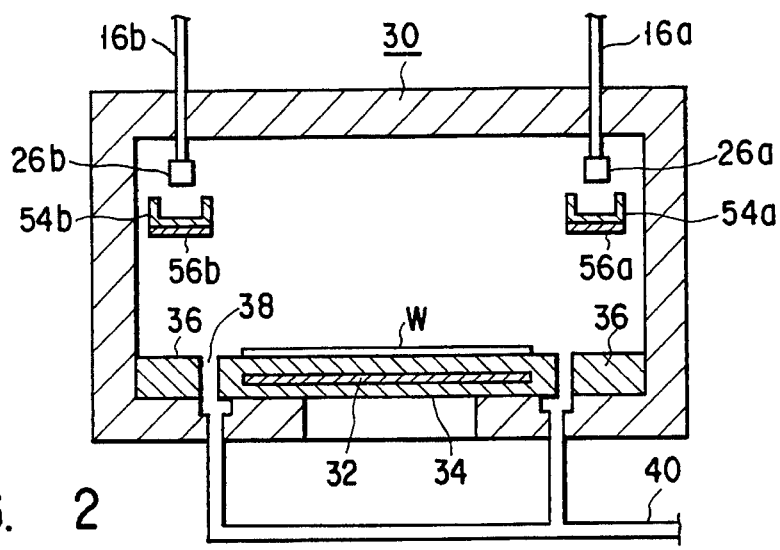
FIG. 2 is a sectional view showing the main part of a variation of the process chamber shown in FIG. 1.

In a variation shown in FIG. 2, trays 54a and 54b as liquid receiving portions are arranged above the mount 34. They are positioned to deviate from any vertical lines passing through the wafer W which is placed on the mount 34. They are detachably fixed to side walls of the process chamber 30 by support members (not shown). Attached integral to their undersides are heater means such as heating resistances 56a and 56b. Positioned just above them are nozzles 26a and 26b which are attached to the front ends of the pipes 16a and 16b.

When arranged in this manner, the trays 54a and 54b can be heated, as desired, by the heating resistances 56a and 56b, as seen in the case of the recesses 50a and 50b in the first hydrophobic treatment apparatus. When the predetermined amount of HMDS liquid is dropped into these trays 54a and 54b through the nozzles 26a, and 26b, all of the HMDS liquid thus dropped can be instantly vaporized into HMDS gas. The process chamber 30 has been decompressed to the certain value. The HMDS gas thus created can be therefore quickly diffused from the trays 54a and 54b into the process chamber 30 to fill it with process gas atmosphere.

Figure 3:
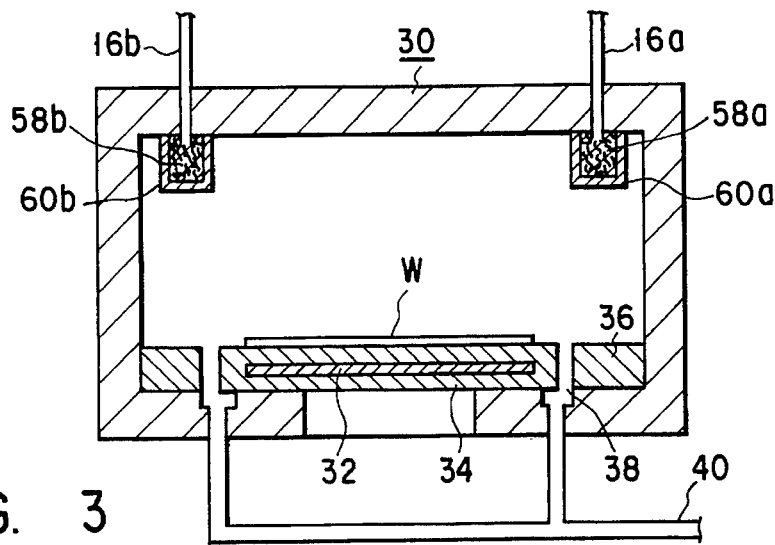
FIG. 3 is a sectional view showing the main part of another variation of the process chamber.

In another variation shown in FIG. 3, liquid receiving members 58a and 58b are made of filter resin or fibers. They are also position to deviate from any vertical lines passing through the wafer W which is placed on the mount 34 in the process chamber 30. They are arranged in their corresponding mesh-like heating resistances 60a and 60b. No nozzle is attached to the front end of each of the pipes 16a and 16b, which are instead inserted directly into the liquid receiving members 58a and 58b. when arranged in this manner, the liquid receiving member 58a and 58b can be heated, as desired, by the heating resistances 60a and 60b and the predetermined amount of HMDS liquid is introduced into heated filter resin or fibers of the liquid receiving members 58a and 58b through the pipes 16a and 16b. The HMDS liquid thus introduced can be therefore instantly or gradually vaporized into HMDS gas in the filter resin or fibers. The process chamber 30 has been decompressed negative to a certain value. Therefore, the HMDS gas can be quickly diffused in all directions or downwards from the liquid receiving members 58a and 58b in the process chamber 30. HMDS gas atmosphere can be thus created in the process chamber 30.

Figure 4:
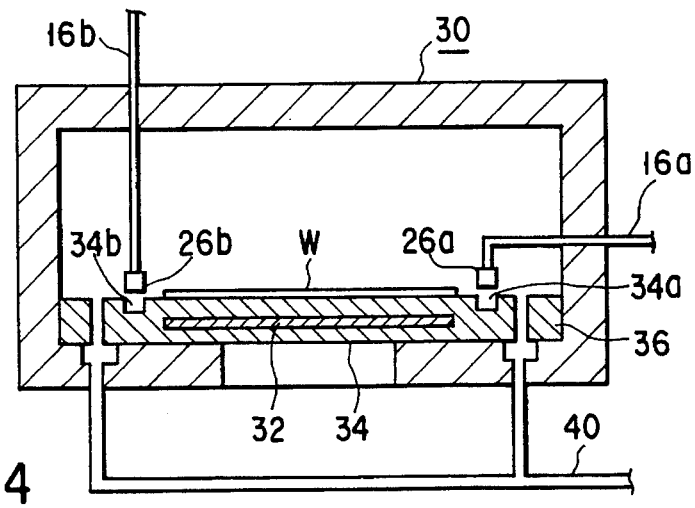
FIG. 4 is a sectional view showing the main part of a further variation of the process chamber.

In a further variation shown in FIG. 4, liquid receiving recesses 34a and 34b are formed in the top of the mount 34 and adjacent to the outer rim of the mount 34. When the recesses 34a and 34b are arranged in this manner, the heater means (or resistance heater) 32 embedded in the mount 34 can also be used to heat the recesses 34a and 34b. This makes it unnecessary to use additional heater means for the liquid receiving portions 34a and 34b. Further, the pipe 16a extends just above the recess 34a, passing not through the top of the process chamber 30 but through a side wall thereof. This means that HMDS liquid can be supplied into the process chamber 30 through the pipe which passes through a desired part of the process chamber 30.

FIG. 5 shows a hydrophobic treatment apparatus according to a second embodiment of the present invention. Same components as those in the first embodiment will be denoted by the same reference numerals and description on them will be made only when needed.

In the first embodiment, an inert gas, such as $N_2$ gas, is introduced into the tank 12 and HMDS liquid in the tank 12 is fed into the pipe 16 by the pressure of the inert gas introduced. A pump can be used instead of this pressurising gas to feed HMDS liquid from the tank 12 into the pipe 16. In contrast, when difference h between the top level of HMDS liquid in a process agent storing container (or bottle) 62 and the lower end of the nozzle 26, that is, the attraction of gravity is used as seen in this second example, however, HMDS liquid can be supplied into the process chamber 30 only in an amount needed at any desired time without using any specific feeding means such as the pressurising gas or pump.

In FIG. 5, the bottle 62 in which HMDS liquid is stored is turned upside down and hung from a support 66 through a tension coil spring 64. The upper end of the pipe 16 extends into the bottle 62. A gas pipe 68 whose one end extends into the bottle 62 is intended to introduce air (or $N_2$ gas) into the bottle 62 to allow HMDS liquid to be fed into the process chamber 30.

When HMDS liquid in the bottle 62 decreases in this second example, the tension coil spring 64 shrinks to pull the bottle 62 upward. When the coil spring 64 is selected to have an appropriate spring constant, therefore, the top level of HMDS liquid in the bottle 62 or the difference h can be kept constant from the lower end of the nozzle 26 even if the amount of HMDS liquid in the bottle 62 changes. The pipe 16 is made flexible at a part thereof and this flexible part forms a curved portion 17 as shown in FIG. 5. When the bottle 62 moves up and down, the curved portion 17 can be deformed to keep unchanged that portion of the pipe 16 which extends downward from this curved portion 17. Switch and suck-back valves 22 and 24 attached to the pipe 16 are combined with each other to form a unit 23. It may be arranged that the bottle 62 is moved up and down, while detecting the top level of HMDS liquid in the bottle 62, to keep the difference h constant.

In the second hydrophobic treatment apparatus, the pipe 16 is not divided into plural pipes but it extends, as it is, into the process chamber 30. A relatively large liquid receiving tray 70 is supported in the upper portion of the process chamber 30 by a support (not shown) and the nozzle 26 is arranged just above the tray 70. A heating resistance 72 is embedded in or attached to, as heater means, the liquid receiving tray 70. A plate 74 provided with a plurality of apertures is arranged horizontal between the tray 70 and the mount 34 in the process chamber 30. When the wafer w is to be treated, HMDS gas vaporized in the tray 70 is once stayed in an upper space 30a and then uniformly introduced into a lower space 30b through the apertures-provided plate 74. Needless to say, the pipe 16 may be divided into two or more.

FIG. 6 shows a hydrophobic treatment apparatus according to a third embodiment of the present invention. Same components as those in the first embodiment will be denoted by the same reference numerals and description on them will be made only when needed. In the third example, an HMDS liquid vaporizing chamber 76 is mounted integrally or detachably on the top of the process chamber 30.

Liquid receiving trays 54a and 54b provided with heater means 56a and 56b are arranged in the vaporizing chamber 76. Nozzles 26a and 26b attached to the front ends of the pipes 16a and 16b are arranged just above their corresponding trays 54a and 54b. An exhaust pipe 78 is connected to the vaporizing chamber 76 to decompress it. A switch valve 80 is attached to the exhaust pipe 78. The exhaust pipe 78 is connected to the ejector 42, to which the exhaust pipe 40 connected to the process chamber 30 at one ends is also connected at the other end.

An opening 30c through which HMDS gas is introduced from the vaporizing chamber 76 into the process chamber 30 is formed in the center of the top wall of the process chamber 30. A shutter 82 which selectively opens and closes the opening 30c is arranged on the wall of the process chamber 30. A drive unit 84 for driving the shutter 82 is also arranged on the top wall of the process chamber 30. A plate 86 provided with a plurality of apertures is arranged in the process chamber 30 to uniformly diffuse HMDS gas introduced into the process chamber 30.

According to the third hydrophobic treatment apparatus, the switch valve 46 is opened to decompress the process chamber 30 to a predetermined value prior to the hydrophobic treatment, while the switch valve 80 is also opened to decompress the vaporizing chamber 76 to the same value. The predetermined amount of HMDS liquid is dropped into the trays 54a and 54b through the nozzles 26a and 26b. As soon as the HMDS liquid thus dropped is vaporized into HMDS gas in the vaporizing chamber 76, the drive unit 84 is made operative to open the shutter 82. Pressure in the vaporizing chamber 76 is made higher than that in the process chamber 30 because HMDS gas is generated in the vaporizing chamber 76. When the shutter 82 is opened, therefore, HMDS gas in the vaporizing chamber 76 moves into the process chamber 30 through the opening 30c. The HMDS gas thus moved into the process chamber 30 is uniformly applied to the wafer W, passing through the apertures-provided plate 86.

In the third embodiment, HMDS liquid is supplied into the vaporizing chamber 76, which is on the top of the process chamber 30, in an amount needed at any desired time, then vaporized into HMDS gas in the vaporizing chamber 76, and the HMDS gas thus generated is further moved into the process chamber 30, as described above. With this embodiment, merits of the present invention can be achieved, too.

Figure 7:
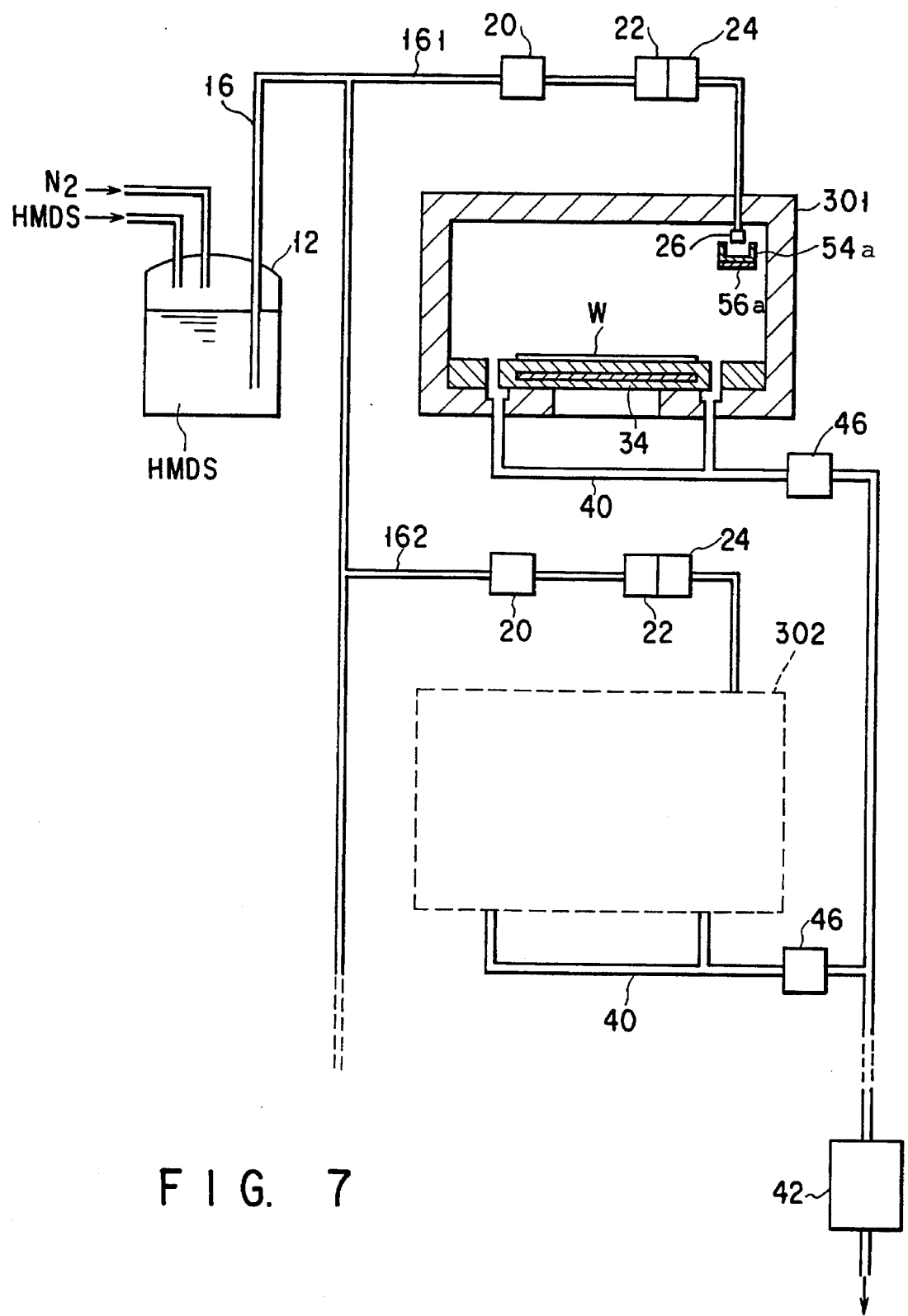
FIG. 7 is a partly-sectioned view showing the hydrophobic treatment apparatus according to a fourth embodiment of the present invention.
Figure 7:
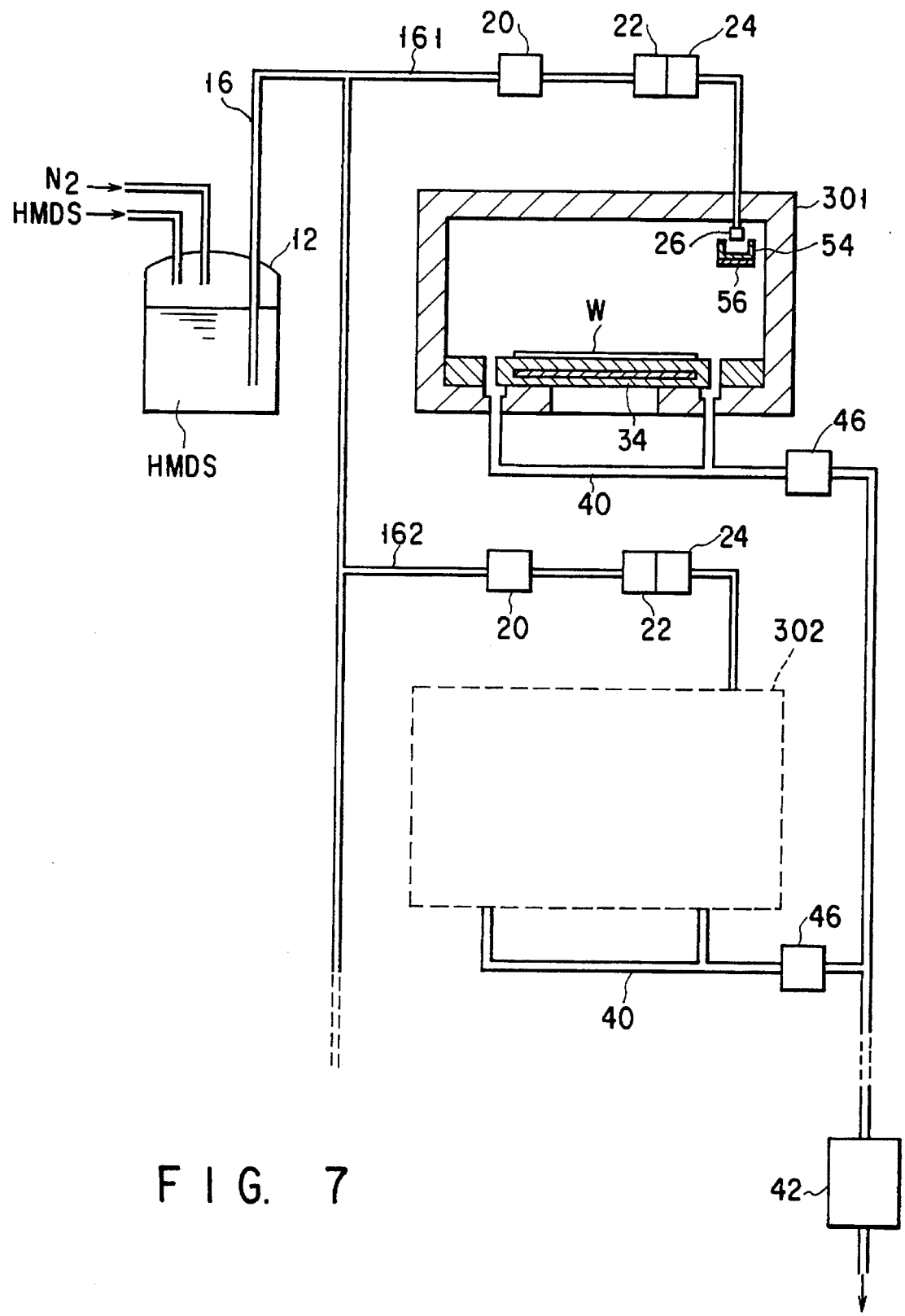

FIG. 7 shows a hydrophobic treatment system of the multi-type according to a fourth embodiment of the present invention in which plural process chambers are combined with one another. A wafer W is treated at a time in each of the process chambers. In this system, HMDS liquid can be supplied from a common tank 12 into plural process chambers 301, 302, ... through pipes in an amount needed at any desired time. Because HMDS supplied into the process chambers is liquefied, the density of HMDS liquid can be kept certain even if HMDS liquid is distributed into plural pipes 161, 162, . . . which branch from the pipe 16. Therefore, the process agent feeding unit which connects plural chambers 301, 302, . . . to one common tank 12 can be made simple enough. This makes it easy to construct the multi-type system.

Although some preferred embodiments of the present invention have been described above, it should be understood that the present invention is not limited to these embodiments and that various changes and modifications can be made without departing from the scope and spirit of the present invention. For example, the process chamber 30 may be formed by a cup body and a top lid. Further, the mount 34 may be made optional. Wafer support means such as support pins can be used instead of the mount 34. Still further, heater means embedded in or attached to the liquid receiving means are not limited to the heating resistances but they may be those of the light and heat type or of the oil heater type.

Although HMDS has been used, as process gas, in all of the above-described hydrophobic treatment apparatus, the present invention can also be applied to those hydrophobic treatment apparatus in which one of other process agents is used. N-(trimethylsilyl) diethylamine $[(CH_3)_3SIN(C_2H_5)_2]$ can be used instead of HMDS. Further, it can also be applied to the other process apparatus in which a process agent must be vaporized. When a process agent is volatile, heater means can be omitted in the process or vaporizing chamber.

The present invention can also be applied to those process apparatus of the batch type in which substrates are processed in a batch. Substrates to be processed are not limited to the semiconductor wafers but they may be LCD, glass, CD and other substrates. Further, the process chamber, the mount and other components are made to match the kinds and sizes of substrate to be processed. The hydrophobic treatment apparatus of the present invention, however, becomes suitable particularly when it is incorporated into the resist coating and developing system for semiconductor wafers and LCD substrates.

What is claimed is:

1. An apparatus for subjecting a surface of a substrate to hydrophobic treatment with a process agent in vapor phase, comprising:

a container having a first space containing the process agent in liquid phase;

a casing having a process space, said process space being used to vaporize the process agent, to house the substrate therein and to expose the surface of the substrate to a vaporized material consisting essentially of the process agent in vapor phase so as to subject it to the hydrophobic treatment;

a conduit for dropping the process agent in liquid phase from the first space to the process space;

means for vaporizing the process agent, arranged in the process space;

means for supporting the substrate, arranged in the process space; and means for adjusting the amount of the process agent in liquid phase dropped to the process space through the conduit to control the density of the process agent in vapor phase in the process space.

2. The apparatus according to claim 1, wherein said means for vaporizing comprises means for exhausting and decompressing the process space.

3. The apparatus according to claim 2, wherein said means for vaporizing comprises means for heating atmosphere in the process space.

4. The apparatus according to claim 3, wherein said means for supporting includes means for heating the substrate.

5. The apparatus according to claim 4, wherein means for receiving the process agent in liquid phase dropped through the conduit is arranged in the process space.

6. The apparatus according to claim 5, wherein said means for receiving comprises first and second liquid receiving members, said means for exhausting comprises first and second exhaust ports, and said first and second liquid receiving members are arranged on a straight line crossing another straight line on which said first and second exhaust ports are arranged.

7. The apparatus according to claim 5, wherein said means for receiving includes means for heating the process agent.

8. The apparatus according to claim 7, wherein said means for receiving comprises a liquid receiving member made of filter resin or fibers, into which a front end of said conduit is inserted.

9. The apparatus according to claim 5, wherein said means for receiving is positioned such that it does not intersect any vertical lines passing through the substrate supported by the means for supporting.

10. The apparatus according to claim 5, wherein said container is arranged above the casing to use the attraction of gravity to drop the process agent in liquid phase from the first space to the process space.

11. The apparatus according to claim 10, wherein said container is hung by a spring and said spring has a spring constant such that the top level of the process agent in liquid phase in the container is kept substantially constant even if the amount of the process agent in the container changes.

* * * * *